United States Patent [19]

Benzing

[11] Patent Number: 4,572,759
[45] Date of Patent: Feb. 25, 1986

[54] TROIDE PLASMA REACTOR WITH MAGNETIC ENHANCEMENT

[75] Inventor: David W. Benzing, San Jose, Calif.

[73] Assignee: Benzing Technology, Inc., Santa Clara, Calif.

[21] Appl. No.: 685,499

[22] Filed: Dec. 26, 1984

[51] Int. Cl.[4] .................. H01L 21/306; B44C 1/22; C03C 15/00; C23F 1/02
[52] U.S. Cl. .................. 156/345; 118/50.1; 118/620; 118/728; 156/643; 156/646; 204/298
[58] Field of Search .................. 156/643, 646, 345; 204/164, 192 EC, 192 R, 192 C, 192 E, 298; 118/728, 50.1, 620; 427/38, 39

[56] References Cited

U.S. PATENT DOCUMENTS

| 4,431,473 | 2/1984 | Okano et al. | 156/345 |
| 4,483,737 | 11/1984 | Mantei | 156/643 |
| 4,521,286 | 6/1985 | Horwitz | 156/646 X |

Primary Examiner—William A. Powell
Attorney, Agent, or Firm—Robert O. Guillot

[57] ABSTRACT

A triode apparatus with magnetic enhancement for dry processing semiconductor wafers and the like. A conductive substantially cylindrical chamber contains a cathode that is connected to a first source of AC power. A wafer stage mounted on the inside of the chamber wall is connected to a second source of AC power. The chamber has means for connection to a reference voltage potential. Means for generating a magnetic field perpendicular to the electric field generated between the chamber walls and the cathode is also provided.

27 Claims, 12 Drawing Figures

TROIDE PLASMA REACTOR WITH MAGNETIC ENHANCEMENT

BACKGROUND OF THE INVENTION

1. Field of the Invention

This invention relates to an apparatus in which fine line patterns are etched or thin films are deposited on the surface of a semiconductor wafer by a plasma processing technique. More particularly, this invention relates to an apparatus for creating a plasma medium in a plasma processing reactor having three electrodes together with an optional magnetic enhancement.

2. Description of the Prior Art

Considerable interest exists in employing plasma processing techniques for patterning and/or depositing thin films on work pieces such as semiconductor wafers. The interest in plasma etching techniques stems from their generally better resolution and improved dimensional and shape control capabilities relative to standard wet chemical etching. Thus, plasma etching is being utilized increasingly in, for example, pattern delineation in the processing of semiconductor wafers to form very large scale integrated (VLSI) devices. The interest in plasma deposition techniques stems from their ability to deposit films of lower temperatures then conventional chemical vapor deposition techniques; to deposit more conformal films than conventional physical vapor deposition techniques; to deposit non-stoichoimetric films; and to simultaneously deposit and etch films resulting in a planarized deposition.

Various plasma dry etching processes that involve radio frequency generated plasmas are known. These processes include sputter etching which is described, for example, in J. Vac. Sci. Technol., Vol. 13 No. 5 pp. 1008–1022, September/October 1976, and reactive sputter etching which is described, for example, in Proc. 6 Int 1. Vacuum Congr. 1974, J. Appl. Phys., Suppl. to, Pt. 1, pp. 435–438, 1974. Also, U.S. Pat. No. 4,298,443 issued to Maydan discloses an apparatus for high throughput sputter etching or reactive sputter etching of a wafer comprising a multi-faceted wafer holder centrally disposed within a cylindrical chamber. A source of RF power is capacitively coupled to the wafer holder and the cylindrical chamber is grounded. By establishing a suitable plasma within the chamber simultaneous anisotropic etching of a plurality of wafers can be achieved in an apparatus of small size. In this teaching, only the central multi-faceted wafer holder is connected to a source of RF energy.

Enhanced etching of wafers can be achieved through the utilization of a mangetic field in combination with the electric field that is used to create the plasma. Articles such as V. Minkicwicz, *Magnetic Field Control Of Reactive Plasma Etching*, Applied Physics Letters, 35(5), 1979 and H. Okano, *High Rate Reactive Ion Etching Using A Magnetron Discharge,* ET Electrotech Seminar, Honolulu, Hawaii, Jan. 1, 1981 describe the use of magnetic fields in wafer etching devices. The Materials Research Corporation, Orangeburg, N.Y. has manufactured "Magnetron" Ion Etch Systems which utilize magnetic fields in plasma etch systems. U.S. Pat. No. 4,422,896 describes such a device.

Various plasma deposition processes that involve radio frequency generated plasmas are also known. Articles such as "*Plasma Deposition of Inorganic Films*", J. R. Hollahan and R. S. Rosler in *Thin Film processes,* Academic Press, New York 1978 p. 335.; W. Johnson, "*Design of Plasma Deposition Reactors*", Solid State Technology 25(4) 191 (1983); and M. Rand, J. Vac. Sci Tech. 16(2) 420 (1979). Also, U.S. Pat. No. 3,757,733 issued to Beinberg discloses an apparatus for the deposition of inorganic films on wafers comprising two parallel horizontal electrode disks within a cylindrical vacuum chamber. A source of RF power is capacitively coupled to the upper electrode, and the lower electrode is grounded. By establishing a a suitable plasma within the chamber, an inorganic film is deposited on wafers placed on the lower electrode. In this teaching only the upper electrode is connected to a source of RF energy. U.S. Pat. No. 4,223,048 issued to Engle discloses an apparatus for the deposition of inorganic films on wafers comprising two sets of interleaved planar electrodes disposed within an evacuable envelope and a means for establishing a plasma in the gaps defined between the interleaved electrodes. In this teaching only two electrical potentials are provided.

SUMMARY OF THE PRESENT INVENTION

An object of the present invention is to provide an improved plasma processing apparatus for plasma etching and plasma deposition.

Another object of this invention is to provide a plasma processing apparatus that can processes wafers in less time than a conventional apparatus with better pattern fidelity and etch uniformity.

Another object of this invention is to provide a plasma processing system that process wafers in less time than a conventional apparatus with better deposited film quality and uniformity.

These and other objects are provided by the instant apparatus for the plasma processing of semiconductor wafers and the like. In the invention, a conductive, substantially cylindrical chamber wall is adapted to be connected to a point of reference potential. End plates joined to the chamber wall create an enclosed chamber. A single cylindrical cathode is mounted coaxially inside the chamber, and the cathode is adapted to be connected to a first source of ac power. A wafer stage is removably mounted to the inside surface of the chamber wall and electrically isolated therefrom. The wafer stage is adapted to be connected to a second source of AC power. A gas inlet port and vacuum outlet port are joined to the chamber, such that etchant or deposition gases may be introduced thereinto. A plasma is established from the gas within the chamber at a specified pressure in response to power excitation of the first source of AC power which creates an electric field between the cathode and the chamber wall. Excitation of the second source of AC power applies an electric potential to the wafer stage which modifies the electric field in the vicinity of the wafer to aid processing. In a preferred embodiment, the chamber also includes means for establishing a magnetic field that is substantially perpendicular to the electric field for enhanced processing.

It is an advantage of the present invention that an improved plasma processing apparatus for etching and deposition is provided.

It is another advantage of the present invention that wafers with better pattern fidelity and etch uniformity can be created.

It is another advantage of the present invention that films with better quality and thickness uniformity can be deposited on wafers.

These and other objects and advantages of the present invention will no doubt become apparent to those of ordinary skill in the art after having read the following detailed description of the preferred embodiments which are illustrated in the several figures of the drawing.

IN THE DRAWING

DETAILED DESCRIPTION OF THE PREFERRED EMBODIMENTS

Figure 1:
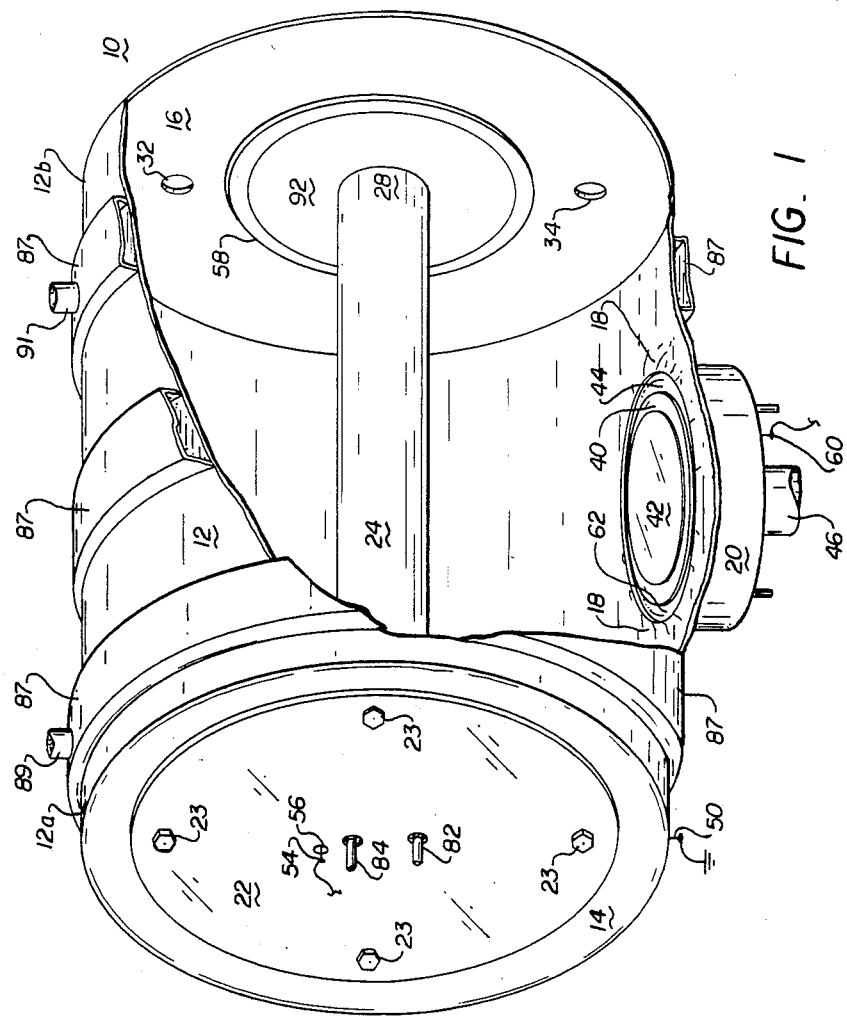
FIG. 1 shows an isometric view of a first embodiment of the present invention having a cut-away section to reveal the inner components of the device.
Figure 2:
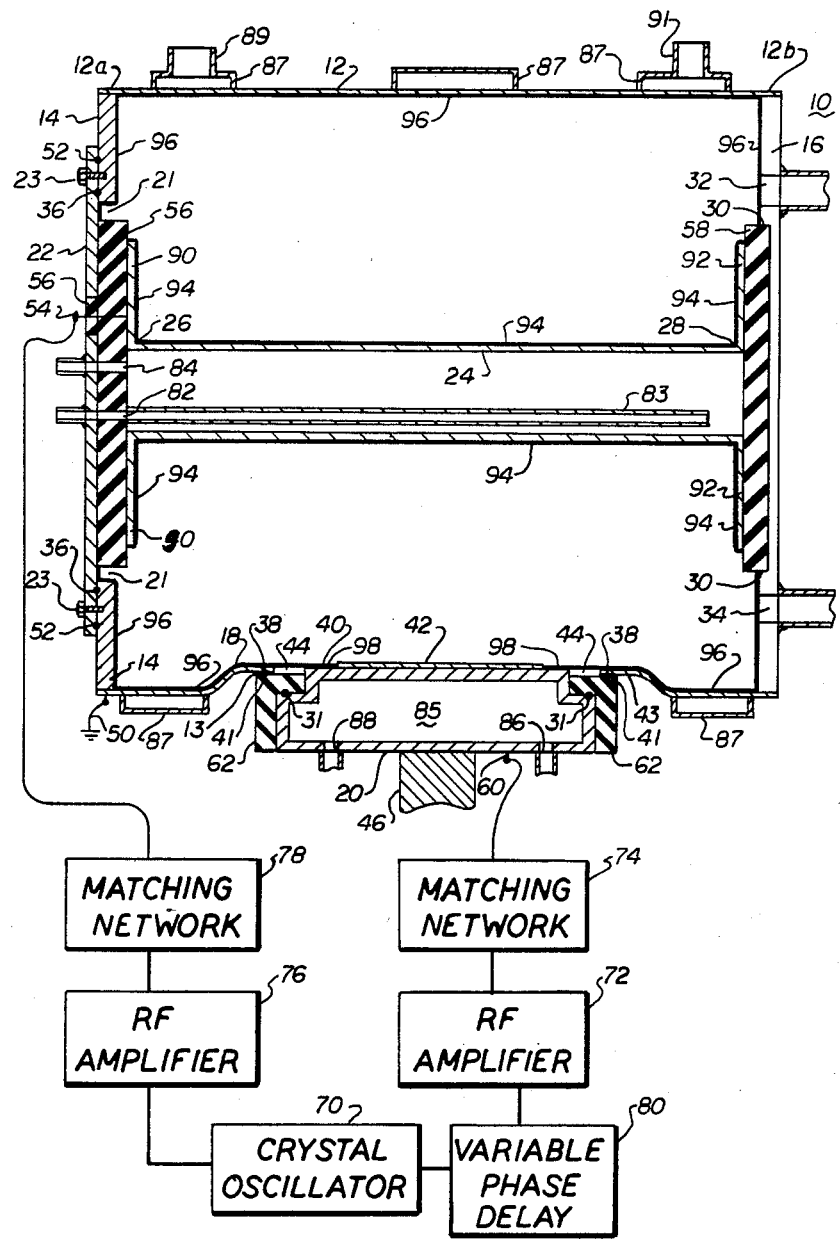
FIG. 2 shows a sectional side view with a schematic diagram of the associated electronic circuitry of a preferred embodiment of the present invention.

Referring to FIGS. 1 and 2, a plasma reactor 10 of this invention has a substantially cylindrical chamber wall 12 with a first end plate 14 joined, such as by welding, to a first end 12a of the chamber wall 12, and a second end plate 16 joined to a second end 12b of the chamber wall 12. A portion 18 of the wall 12 is flattened to provide a flat surface upon which to mount a wafer stage 20 to wall 12 within the chamber. The first end plate 14 has a cut-away central portion 21 and a cathode mounting plate 22 that covers the cut-away portion 21. The plate 22 is removeably joined to the first end plate 14 by bolts 23 or other suitable means. A cathode 24 is mounted coaxially with the central axis of the cylindrical chamber, such that a first end 26 of the cathode 24 is joined to the cathode mounting plate 22 and the distal end 28 of the cathode 24 is removeably held in a recess 30 formed in the second end plate 16. The second end plate 16 is penetrated by a process gas inlet port 32 for inletting processing gas into the chamber and a vacuum outlet port 34 for pressure regulation and removal of gases from the chamber.

The wafer stage 20 has a flat circular metal platform 40 upon which a circular wafer 42 to be processed is mounted. The wafer stage is formed to mate in an opening 44 formed in the flattened side 18 of the chamber wall 12, such that the outer edge 41 of the upper surface of the wafer stage 20 will make good contact with the outer surface 43 of the flattened side 18 proximate the opening 44. The wafer stage must be designed to permit the insertion of wafers to be processed into the chamber and the removal of processed wafers from the chamber. The mounting of the wafer stage 20, in the preferred embodiment, is through the utilization of a piston rod 46 that is connected to a pneumatic or hydraulic system, not shown. The raising and lowering of the piston rod moves the wafer stage into and out of mating relationship with opening 44 such that the loading and unloading of wafers may be accomplished. Other means of accomplishing the placement and removal of wafers upon the wafer stage can be utilized.

In order to promote the formation and retention of a vacuum within the chamber, it is necessary to provide vacuum seals at the juncture of the cathode mounting plate 22 with the first end plate 14, within the wafer stage 20 at the junction of the metal platform 40 and the insulator 62, and at the juncture of the wafer stage 20 with the chamber wall 18. In the preferred embodiment, O-ring seals 36, 31 and 38, respectively, are placed in seal grooves at the respective junctions.

Three electrical connections are made to the device 10 to create a triode electrical effect. The chamber wall 12 is provided with an electrical connector 50. The cathode mounting plate 22 is electrically connected to the first end plate 14 by means of an O-ring encased in a fine wire mesh 52, although other means of electrical connection of the mounting plate 22 may be utilized. The chamber wall 12, first end plate 14, second end plate 16 and mounting plate 22 are therefore all held at one potential. The cathode 24 is provided with an electrical connector 54, and the cathode is electrically isolated from the cathode mounting plate 22 by insulating material 56 and from the second end plate 16 by insulating material 58. The wafer stage 20 has an electrical connector 60, and the wafer stage is electrically insulated from the chamber wall 18 by insulating material 62. The insulating materials 56, 58, and 62 must function in a reduced pressure environment with etchant gases and/or deposition gases, depending upon the utilization of the device. Material such as Teflon, Quartz, Delrin, Macor (TM for product produced by Corning), Alumina, Ardel (TM for product produced by Union Carbide), and Beryllia, have been found to be suitable insulating materials. It is therefore to be understood that when the device is electrically activated, the chamber wall 12 and end plates 14 and 16 and mounting plate 22 are held at one potential. The cathode is held at a second potential and the wafer stage is held at a third potential, whereby a triode effect is created.

The device 10 functions by utilizing appropriate electrical energy to create a plasma from the processing gas between the cathode 24 and chamber wall 12. The wafer stage 20 is provided with its own potential to increase the processing effects of the plasma upon the surface of the wafer 42 which is placed upon the upper surface of the wafer stage. In the preferred embodiment, the chamber wall 12 is held at ground potential, the cathode 20 is powered by a first AC energy source and the wafer stage 20 is powered by a second energy source. The preferred AC energy for both sources is radio frequency (RF) energy in the range of about 8 kilohertz to 50 megahertz, although the use of zero hertz (direct current) energy to the wafer stage is also feasible in some applications. In the following discussion, it will be assumed that RF energy of 13.56 megahertz is utilized for both sources.

In the preferred embodiment, a single device, such as a single crystal oscillator 70 is used to generate both the cathode and the wafer stage RF frequency. The wafer stage circuit contains an amplifier 72, to regulate and amplify the power to the stage and a matching network 74 to match the impedance of the load with that of the amplifier 72, thus maximizing power transmission.

The cathode circuit also has an amplifier 76 and a matching network 78. To optimize the triode processing effects, the wafer stage circuit is provided with a variable phase delay 80 between the signal source and the amplifier. The phase of the RF power delivered to the wafer stage relative to the cathode may be adjusted by the variable phase delay 80 from −180 to +180 degrees. The optimum phase relationship depends upon the frequency of the RF energy chosen, the geometry of the chamber and the pressure and the nature of the gases used. When the optimum phase relationship between the wafer stage and the cathode is utilized, the processing rate is enhanced. Other embodiments of electrical circuitry, such as two separate crystal oscillators or one source of AC energy split between the two powered electrodes are also possible. All such electrical circuitry embodiments which result in the above-described triode effects are within the scope of the invention.

Control of both the chamber and wafer stage temperature is desirable to achieve optimum results. To that end, separate temperature-controlled fluid circulation systems are employed with both the chamber walls and the wafer stage. The wafer stage is formed with a cavity 85, inlet port 86 and outlet port 88 to permit the circulation of a temperature controlled fluid through the wafer stage resulting in temperature control of the wafer stage itself. Similarly, the chamber walls are formed with connected hollow channels 87, inlet port 89 and outlet port 91 to permit circulation of a temperature-controlled fluid. The desired range of temperature control is −5 degrees Centigrade to +80 degrees Centigrade for most etching and some deposition applications. Where temperatures in excess of +80 degrees Centigrade are required, as in the depositin of silicon nitride, the fluid circulation systems may be replaced by resistive heating elements, allowing operation up to +350 C.

When the system is operated in the etching mode as described hereinafter, a significant heat buildup generally occurs in the cathode. To minimize the deleterious effects of the heat, a cooling fluid circulation system is employed in the cathode. The cathode cooling system requires a fluid inlet port 82 and an outlet port 84. The cathode is formed to be hollow and water tight with the inlet and outlet ports joined to the hollow cavity in the cathode to permit cooling fluid to circulate within the cathode. A fluid distribution tube 83 connected to the inlet port within the hollow cavity provides for circulation of the cooling fluid throughout the cavity and ensures uniform cooling. The desired range of temperature control of the cathode is generally −5 degrees Centigrade to +20 degrees Centigrade.

An additional feature of the cahode of the preferred embodiment is the utilization of the conducting end flanges 90 and 92 that extend radially from each end of the cathode 20. The flanges 90 and 92 serve to modify the generally radial electric field between the cathode and the chamber wall in the areas close to the ends of the cathode 20, such that the plasma discharge between the cathode and chamber wall is concentrated towards the center of the chamber proximate the wafer stage.

In order to avoid contamination of the wafer, as caused by sputtering during an etching process, the outer surface of the cathode can be protected by a sleeve or coating 94 of a material, which, when sputtered by the action of the ions in the plasma, reacts with species in the plasma to form a volatile compound that does not deposit on the surface of the wafer. Likewise, the inner surface of the wall 12 and the wafer stage can also be covered by an insert lining or coating 96, and 98, respectively to prevent contamination of the wafer. Suitable coating materials include graphite, silicon, teflon, aluminum oxide, silicon dioxide and Ardel.

The relative dimensions of the present invention are important but not critical. The diameter of the chamber is approximately twice the diameter of the wafer stage. The wafer stage diameter is approximately 1.3 times greater than the diameter of the wafer being process. The diameter of the cathode is approximately 10 to 15% of the diameter of the chamber. The length of the chamber is approximately twice the diameter of the wafer stage. Thus, for the etching of circular wafers that are 6 inches in diameter, the wafer stage is approximately 8 inches in diameter, the chamber diameter is approximately 16 inches, the cathode diameter is approximately 2 inches and the chamber length is approximately 16 inches.

Magnetic enhancement of the triode effect of the present invention improves the etching rate and etching accuracy. FIGS. 3, 4, 5, 6, 7 and 8, depict various magnetically enhanced preferred embodiments of the present invention. In each of the embodiments of FIGS. 3, 4, 5, 6, 7 and 8, a magnetic field is created in the chamber, which field is aligned parallel to the central axis of the chamber and, in the region above the surface of the wafer, is perpendicular to the radial electric field between the cathode and the chamber wall. The magnetic field acts upon the electrons and ions in the plasma to further enhance the processing effects of the device. It is believed that the two perpendicular fields force the electrons in the plasma to tend to orbit around the cathode in accordance with the right-hand rule, whereby loss of electrons due to diffusion out of the plasma is minimized compared to non-magnetically enhanced processing. This results in a intense plasma having a higher concentration of electrons and reactive species and a higher etch rate. A strength of the magnetic field in the range of 50 to 200 Gauss appears to be preferred, with the optimum strength depending upon the RF field strength, the processing gas and the dimensions of the various components of the chamber.

Figure 4:
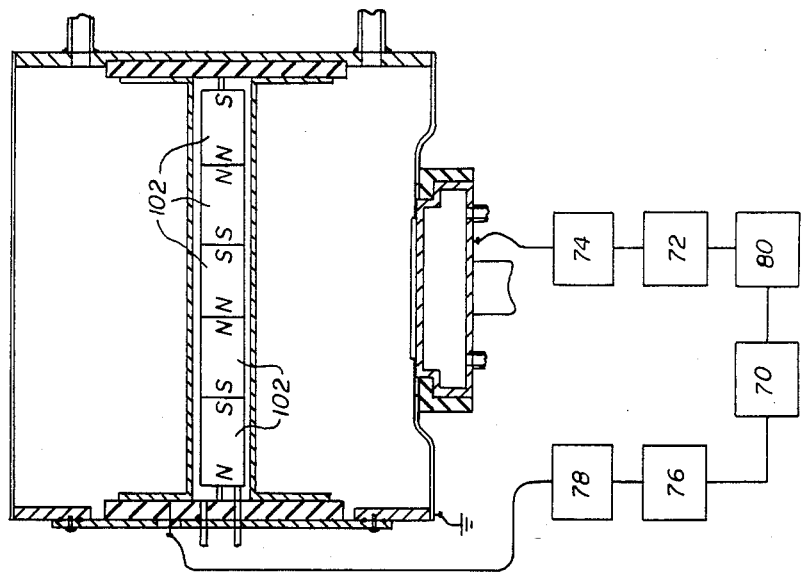
FIG. 4 depicts a sectional side view of another magnetically enhanced alternative embodiment of the present invention.
Figure 3:
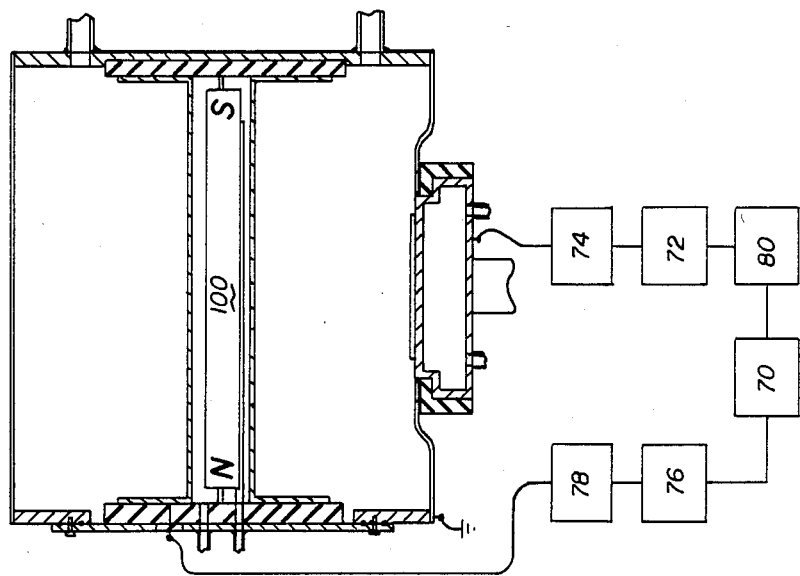
FIG. 3 shows a sectional side view of a magnetically enhanced alternative embodiment of the present invention.
Figure 5:
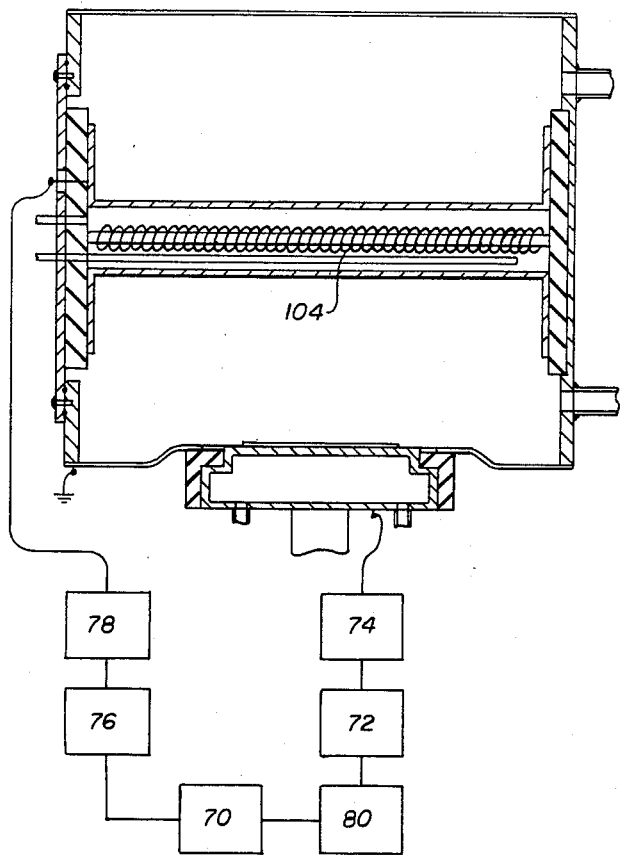
FIG. 5 depicts a sectional side view of yet another magnetically enhanced alternative embodiment of the present invention.
Figure 7:
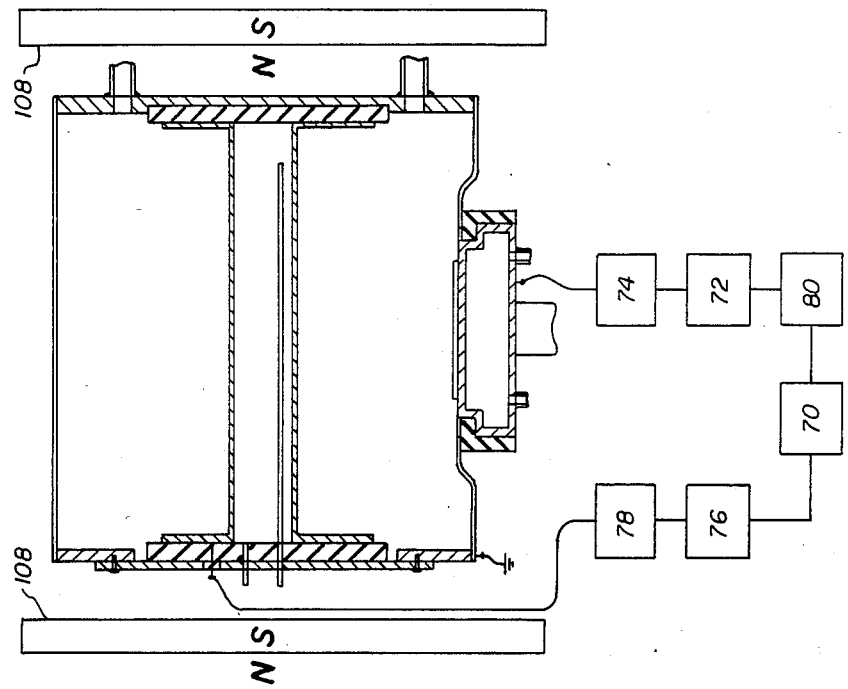
FIG. 7 depicts a sectional side view of yet a further magnetically enhanced alternative embodiment of the present invention.
Figure 6:
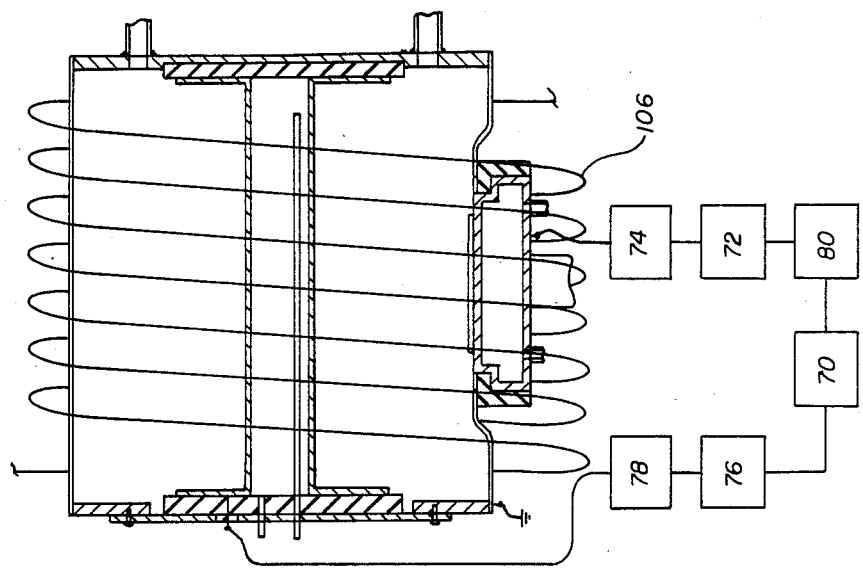
FIG. 6 depicts a sectional side view of a further magnetically enhanced alternative embodiment of the present invention.
Figure 8:
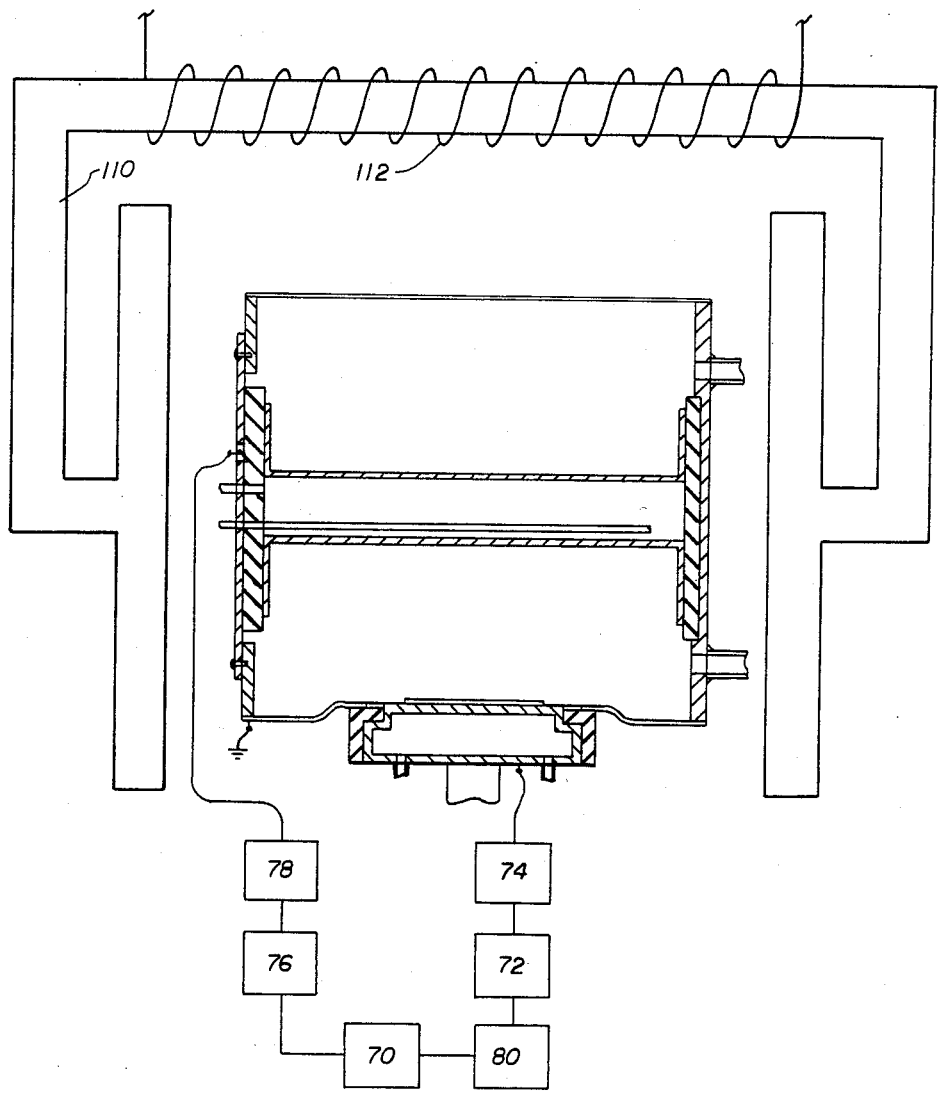
FIG. 8 depicts a sectional side view of still another magnetically enhanced alternative embodiment of the present invention.

FIG. 3 depicts a first magnetically enhanced triode reactor in which a bar magnet 100 is placed within the cooling core of the cathode. FIG. 4 depicts a second magnetically enhanced triode plasma reactor in which a series of bar magnets 102 are sequentially arranged north to north and south to south within the core of the cathode. Such an arrangement preferentially requires a sinusoidal lateral translation of the set of magnets to prevent undue deterioration of the cathode or cathode coating proximate the north to north and south to south field junction where the magnetic field is not generally perpendicular to the electrical field. FIG. 5 depicts an electromagnet 104 placed within the core of the cathode. FIG. 6 depicts an entire chamber of the present invention disposed within the windings of a large electromagnetic coil 106. FIG. 7 depicts two large magnets 108 placed at opposite ends of the chamber. FIG. 8 depicts one large "U" shaped magnet 110 with an optional additional electromagnetic enhancement 112. Other methods of creating a suitable magnetic field are well within the scope of the skilled worker.

Figure 9:
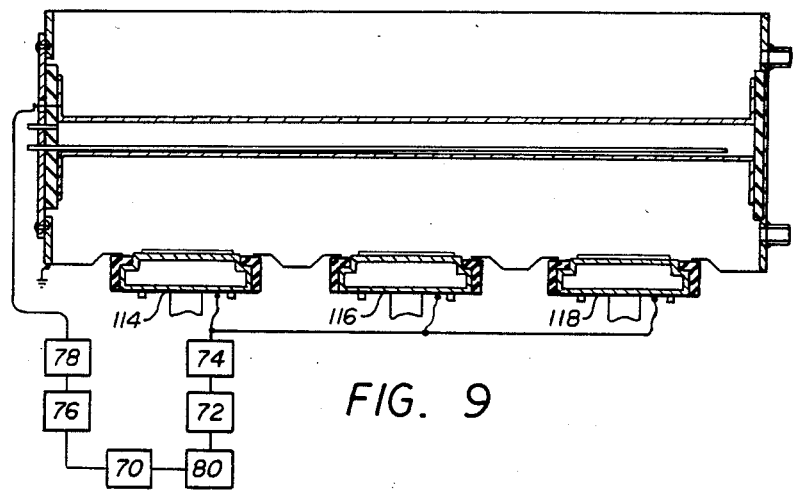
FIG. 9 depicts a multiple wafer embodiment of the present invention.

Referring now to FIG. 9, more than one wafer can be processed by the apparatus depicted therein. The three separate circular wafer stages 114, 116 and 118 are mounted similarly to the single stage described hereinabove. Other than the obvious change in the length of the chamber, the remaining characteristics of the chamber and its elements are as described hereinabove.

Figure 10:
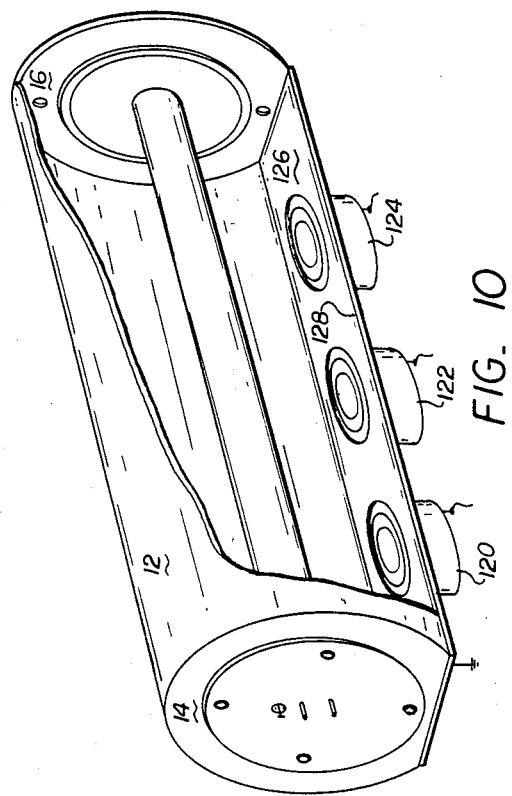
FIG. 10 depicts another multiple wafer embodiment of the present invention.

Referring now to FIG. 10, three wafer stages 120, 122 and 124 are shown mounted on a single elongated wafer stage plate 126. The stage plate 126 is removably joined to the chamber wall 12 and the cutoff end plates 14 and 16, such that all three wafers may be removed simultaneously. An appropriate O-ring seal 128 at the junction of the plate 126 with the wall 12 and the end plates 14 and 16 is required. Additionally, the plate 126 should be electrically connected to the wall 12 to create the appropriate electric field proximate the wafer stages. An O-ring encased in a metal mesh as previously described is a suitable connector.

Figure 11:
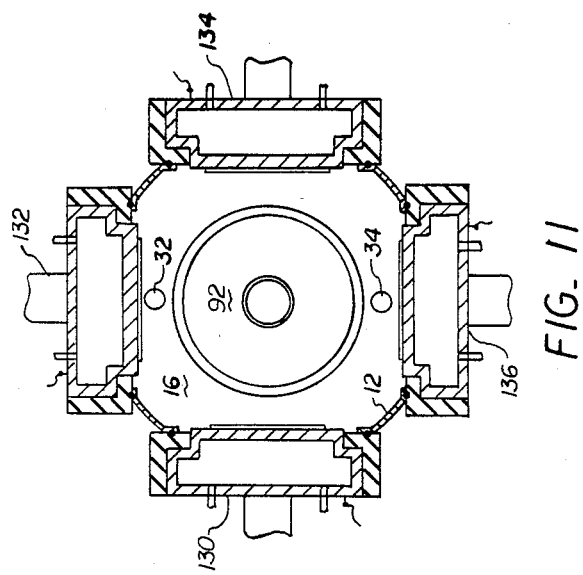
FIG. 11 depicts yet another multiple wafer embodiment of the present invention.

Referring to FIG. 11, another alternative method of mounting a plurality of wafers is depicted. FIG. 11 depicts a cross-sectional view of a chamber having four wafer stages 130, 132, 134 and 136 mounted circumferentially around the chamber wall an equal distance from the cathode. Each stage is substantially similar to that described hereinabove. Of course, a similar device having two, three and perhaps five or more wafer stages surrounding the circumference could be created with modifications in the dimensions of the device.

Figure 12:
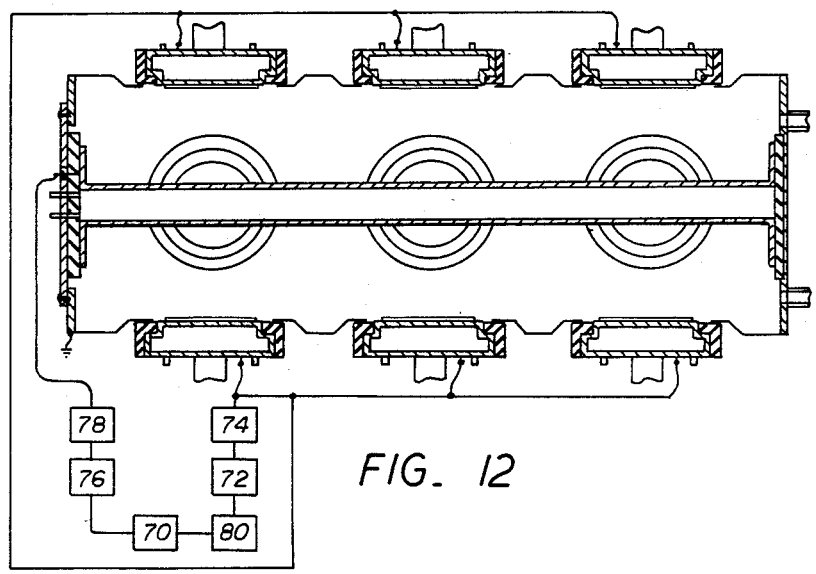
FIG. 12 depicts a further multiple wafer embodiment of the present invention.

A combination of the two approaches of FIGS. 9 and 11 is depicted in FIG. 12 which is a side view similar to FIG. 9. As depicted therein, four circumferentially displaced sets of three linearly disposed wafer stages are presented. One set of three stages is not shown due to the view. Of course, the device depicted in FIG. 10 could also be altered to include a plurality of circumferentially disposed wafer stage plates, each having a plurality of wafer stages mounted thereon.

It is to be realized that the instant invention contemplates the utilization of magnetic enhancement, as depicted in FIGS. 3–8, together with the multiple wafer stage embodiments depicted in FIGS. 9–12.

The etching in any of the devices described hereinabove can be carried out with conventional dry etching gases such as, for example, substantially pure oxygen, chlorine, $NF_3$, $C_2F_6$, $CHF_3$, $BCl_3$, $SiF_4$, or $CF_3Br$ mixtures thereof, or mixtures of the above gases with helium, argon, nitrogen, hydrogen, xenon, neon or krypton, or other gaseous atmospheres known to the art to be suitable for dry etching techniques.

For example, in the non-magnetically enhanced single wafer stage device depicted in FIGS. 1 and 2, polysilicon can be etched at approximately 0.6 u/min with etch rate selectivity of 20:1 over silicon oxide using an atmosphere of 40 Sccm $Cl_2$, 20 Sccm $CF_3Br$, at a total pressure of 150 millitorr. One thousand watts is applied to the central cathode, 300 watts is applied to the wafer stage with a relative phase angle of 100 degrees between the RF signals. The cathode is held at 20 degrees C., the stage at 25 degrees C. and the chamber at 30 degrees C. In the magnetically enhanced single wafer stage device, such as is depicted in FIGS. 3–8, polysilicon can be etched at approximately 1.1 u/min with etch rate selectively of 30:1 over silicon oxide using an atmosphere of 40 Sccm $Cl_2$, 15 Sccm $CF_3Br$, at a total pressure of 250 millitorr. The magnetic field has a strength of 50 Gauss. Seven-hundred-fifty watts is applied to the central cathode, 250 watts is applied to the wafer stage with a relative phase angle of 120 degrees C., the stage at 25 degrees C. and the chamber at 30 degrees C.

The reactor of the present invention can be used not only for dry etching of semiconductor wafers and the like, but also for deposition techniques. The reactive gases must be chosen so that under the influence of the plasma conditions inside the reactor, they deposit material onto the wafer. As an example, in the non-magnetically enhanced single device depicted in FIGS. 1 and 2, if the deposited material is to be silicon nitride, the conditions include 175 sccm $N_2$, 100 sccm $NH_3$, and 30 sccm $SiH_4$, and a pressure of 0.5 torr. 700 watts RF power is applied at the cathode and 150 watts is applied at the wafer stage with a phase angle of about 105 degrees between the two signals. The chamber is held at approximately 100 degrees Centigrade while the wafer stage temperature is kept at approximately 300 degrees Centigrade. An electrical heater is used to obtain this temperature rather than the cooling device of the wafer stage when etching. It has been found that a silicon nitride deposition rate of 2200 Å/min is achievable.

In the single magnetically enhanced single stage device depicted in FIGS. 3–8, if the deposited material is to be silicon nitride, the conditions include 200 sccm $N_2$, 100 sccm $NH_3$, and 25 sccm $SiH_4$, and a pressure of 0.5 torr. 500 watts RF power is applied at the cathode and 100 watts is applied at the wafer stage with a phase angle of about 100 degrees between the two signals. A magnetic field of 100 Gauss is provided. The chamber is held at approximately 150 degrees Centigrade while the wafer stage temperature is kept at approximately 300 degrees Centigrade. It has been found that a silicon nitrade drop rate of 3000 Å/min is achievable.

As will be clear to those skilled in the art alterations and modifications may be made to the disclosed embodiment without departing from the inventive concepts thereof. the above description is intended therefore to be illustrative and informative but not limiting in scope. Accordingly, it is intended that the following claims be interpreted as covering all such alterations and modifications that reasonably fall within the true spirit and scope of this invention.

What is claimed is:

1. An apparatus for dry plasma processing of semiconductor wafers, and the like comprising:

a chamber, being formed by walls which are electrically conductive and adapted to be electrically connected to a point of reference potential;

an electrically conductive cathode being mounted within said chamber and electrically isolated from the walls thereof, said cathode being connected to a first source of electric potential;

a wafer stage being mounted to said chamber wall such that a semiconductor wafer may be removably mounted on said wafer stage, said wafer when so mounted being located within said chamber; said wafer stage being electrically isolated both from said chamber walls and said cathode and being adapted to be connected to a second source of electric potential;

means for the introduction into and removal of gas and gaseous by products from said chamber such that a plasma may be formed within said chamber in response to activation of said first source of electric potential; and means for establishing said second electric potential at a different value from said first electric potential.

2. The apparatus of claim 1 wherein the plasma conditions are suitable for etching a wafer mounted upon said wafer stage.

3. The apparatus of claim 1 wherein the plasma conditions are suitable for deposition of material on a wafer mounted upon said wafer stage.

4. The apparatus of claim 1 wherein said first and second sources of electric potential is a radio frequency alternating current and said first and second sources of electric potential are generated by a single crystal oscillator.

5. The apparatus of claim 4 wherein a means for establishing a variable phase delay is connected between said crystal oscillator and at least one of said first source and said second source.

6. The apparatus of claim 1 wherein a means is provided to control the temperature of the cathode, wafer stage and chamber walls.

7. The apparatus of claim 1 wherein a means is provided for establishing a magnetic field which is substantially perpendicular to the electric field established between said chamber wall and said cathode when said first source of power is activated.

8. An apparatus for the plasma processing of semiconductor wafers, and the like comprising:

a substantially cylindrical chamber being formed by an electrically conductive cylindrical wall which is joined to two substantially circular electrically conductive end plates; said wall being adapted to be connected to a point of reference potential;

a single, cylindrical electrically conductive cathode being mounted to one of said end plates and aligned along the central axis of said cylindrical chamber; said cathode being electrically isolated from both said end plates and said wall;

means for connecting said cathode with a first source of radio frequency alternating current power;

a conductive wafer stage mounted to said wall of said chamber such that a semiconductor wafer may be removably mounted on said wafer stage, said wafer when so mounted being located within said chamber; said wafer stage being electrically isolated from both said cathode and said chamber wall;

means for connecting said wafer stage with a second source of radio frequency alternating current power;

means for the introduction into and removal of gas and gaseous by products from said chamber such that a plasma may be formed within said chamber in response to excitation of said first source of power;

means for establishing said second electric potential at a different value from said first electric potential; and means for establishing a magnetic field that is substantially perpendicular to an electric field established between said chamber wall and said cathode when said first source of power is activated.

9. The apparatus of claim 8 wherein said the plasma conditions are suitable for etching a wafer mounted upon said wafer stage.

10. The apparatus of claim 8 wherein the plasma conditions are suitable for deposition of material on a wafer mounted upon said wafer stage.

11. The apparatus of claim 8 wherein said first source of power and said second source of power are generated by a single crystal oscillator.

12. The apparatus of claim 11 wherein a means for establishing a variable phase delay is connected between said crystal oscillator and at least one of said first source of power and said second source of power.

13. The apparatus of claim 8 wherein a means is provided to control the temperature of the cathode water stage and chamber walls.

14. An apparatus for the plasma processing of semiconductor wafers, and the like comprising:

a substantially cylindrical chamber being formed by an electrically conductive cylindrical wall which is joined to two substantially circular electrically conductive end plates; said wall being adapted to be connected to a point of reference potential;

a single, cylindrical electrically conductive cathode being mounted to one of said end plates and aligned along the central axis of said cylindrical chamber; said cathode being electrically isolated from both said end plates and said wall;

means for connecting said cathode with a first source of radio frequency alternating current power;

a conductive wafer stage mounted to said wall of said chamber such that a semiconductor wafer may be removably mounted on said wafer stage, said wafer when so mounted being located within said chamber; said wafer stage being electrically isolated from both said cathode and said chamber wall;

means for connecting said wafer stage with a second source of radio frequency alternating current power;

means for the introduction into and removal of gas and gaseous by products from said chamber such that a plasma may be formed within said chamber in response to excitation of said first source of power;

means for establishing said second electric potential at a different value from said first electric potential; and means for establishing a magnetic field that is substantially perpendicular to an electric field established between said chamber wall and said cathode when said first source of power is activated.

15. The apparatus of claim 14 wherein said means for establishing said magnetic field is a bar magnet encased within and coaxial with said cathode.

16. The apparatus of claim 14 wherein said means for establishing said magnetic field is a linearlly arranged pluarlity of bar magnets placed north-to-north and south-to-south within said cathode.

17. The apparatus of claim 14 wherein said means for establishing said magnetic field is an electromagnet placed within and coaxial with said cathode.

18. The apparatus of claim 14 wherein said means for establishing said magnetic field is a electromagnet arranged such that said chamber is located within the coils of said electromagnet.

19. The apparatus of claim 14 wherein said means for establishing said magnetic field consists of two magnets, one being plaaced proximate each of said end plates with the north pole of one magnet facing the south pole of the other magnet.

20. The apparatus of claim 14 wherein said means for establishing said magnetic field consists of a "U" shaped magnet wherein one pole of said magnet is placed proximate one end of said chamber and the other pole of said magnet is placed proximate the other end of said chamber.

21. The apparatus of claim 20 wherein said "U" shaped magnet includes an electrical winding thereabout to create an electromagnet whereby the field strength of said "U" shaped magnet is increased.

22. The apparatus of claim 14 wherein a means is provided to control the temperature of the cathode wafer stage and chamber walls.

23. An apparatus for the plasma processing of semiconductor wafers, and the like comprising:
- a substantially cylindrical chamber being formed by an electrically conductive cylindrical wall which is joined to two electrically conductive end plates; said wall being adapted to be connected to a point of reference potential;
- a single, cylindrical electrically conductive cathode being mounted to one of said end plates and aligned along the central axis of said cylindrical chamber; said cathode being electrically isolated from both said end plates and said wall;
- means for connecting said cathode with a first source of radio frequency alternating current power;
- a plurality of conductive wafer stages mounted to said wall of said chamber such that a semiconductor wafer may be removably mounted on each said wafer stage, each said wafer when so mounted being located within said chamber; said wafer stages being electrically isolated from both said cathode and said chamber wall;
- means for connecting each said wafer stage with a second source of radio frequency alternating current power;
- means for the introduction into and removal of gas and gaseous by products from said chamber such tha a plasma may be formed within said chamber in response to excitation of said first source of power; and
- means for establishing said second electric potential at a different value from said first electric potential.

24. The apparatus of claim 23 wherein said wafer stages are disposed linearly along said chamber wall.

25. The apparatus of claim 23 wherein said wafer stages are disposed circumferentially about said chamber wall.

26. The apparatus of claim 23 wherein a means is provided for establishing a magnetic field that is substantially perpendicular to an electric field established between said chamber wall and said cathode when said first source of power is activated.

27. The apparatus of claim 23 wherein a means is provided to control the temperature of the cathode wafer stage and chamber walls.

* * * * *